United States Patent [19]
Kawashima et al.

[11] Patent Number: 4,699,554
[45] Date of Patent: Oct. 13, 1987

[54] VACUUM PROCESSING APPARATUS

[75] Inventors: Sosuke Kawashima; Kazuaki Ichihashi, both of Kudamatsu, Japan

[73] Assignee: Hitachi, Ltd., Tokyo, Japan

[21] Appl. No.: 773,296

[22] Filed: Sep. 6, 1985

[30] Foreign Application Priority Data

Sep. 14, 1984 [JP] Japan ................................ 59-191508

[51] Int. Cl.⁴ ........................ A61K 27/02; C23C 15/00
[52] U.S. Cl. ..................................... 414/217; 414/225
[58] Field of Search ......................... 414/217, 222, 225

[56] References Cited

U.S. PATENT DOCUMENTS

| | | | |
|---|---|---|---|
| 3,340,176 | 9/1967 | Belluso et al. | 414/217 X |
| 4,208,159 | 6/1980 | Uehara et al. | 414/225 |
| 4,405,435 | 9/1983 | Tateishi | 118/719 X |
| 4,498,832 | 2/1985 | Corville | 414/217 |
| 4,548,699 | 10/1985 | Hutchison et al. | 414/217 X |
| 4,553,069 | 11/1985 | Purser | 414/225 X |
| 4,584,045 | 4/1986 | Richards | 414/222 X |

FOREIGN PATENT DOCUMENTS 93363  7/1979  Japan .
197145 11/1984  Japan .

Primary Examiner—Robert J. Spar
Assistant Examiner—Stuart J. Millman
Attorney, Agent, or Firm—Antonelli, Terry & Wands

[57] ABSTRACT

This invention is directed to a vacuum processing apparatus which is constructed so that a sample may be carried between a main vacuum chamber and a portion of the atmosphere outside the main vacuum chamber while the sample is retained in a vertical position. The sample is carried in the vertical position through several chambers, including a first vacuum preparatory chamber provided to be communicable with the main vacuum chamber and a second vacuum preparatory chamber provided to be communicable with both the first vacuum preparatory chamber and the atmosphere. By using this apparatus, and in particular by conveying the sample in a vertical position, it is possible to restrain the adhesion of foreign substances on the sample surface which is to be treated. It is also possible to reduce the vacuum load and properly maintain pressure within the main vacuum chamber, thereby enabling increased quality of treatment and also enhancing the manufacturing yield of a semiconductor element.

5 Claims, 7 Drawing Figures

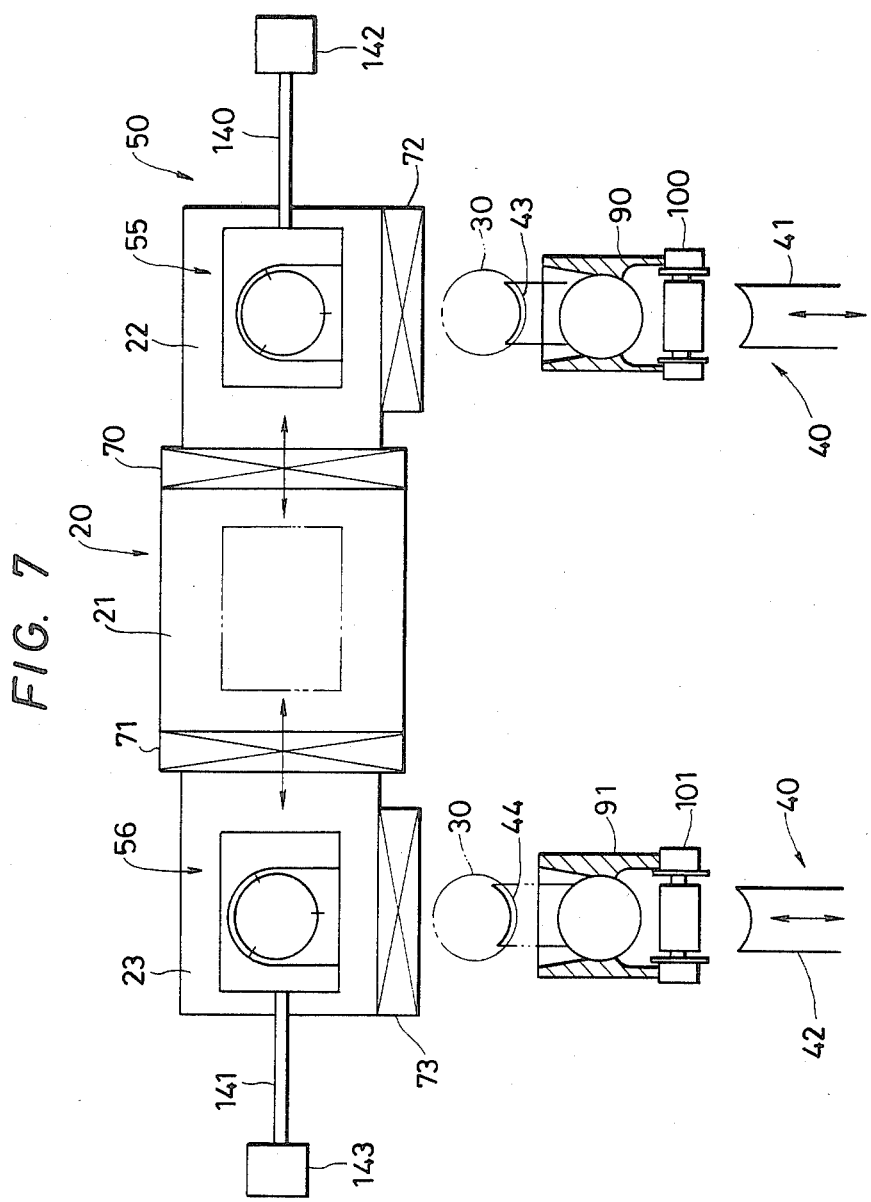

VACUUM PROCESSING APPARATUS

BACKGROUND OF THE INVENTION

1. Field of the Invention

The present invention relates to a vacuum processing apparatus, and more particularly, to a vacuum processing apparatus such as a sputtering apparatus or a dry-etching apparatus which is suitable for effecting a predetermined treatment with respect to a sample under decreased pressure.

2. Description of the Prior Art

Among vacuum processing apparatus such as sputtering apparatus and dry-etching apparatus for performing such predetermined treatments as film forming treatment and etching treatment, a well-known vacuum processing apparatus disclosed, for example, in the specification of Japanese Patent Laid-Open No. 93363/1979, adopts a method wherein the sample is carried between the outside portion and a main vacuum chamber where the sample is subjected to a predetermined treatment in such a way that the sample surface to be treated is so directed in an upward direction as to assume a horizontal attitude.

The sample is conveyed in such a manner that the sample surface to be treated is so directed in an upward direction as to maintain its horizontal attitude, this, however, creates a problem. Namely, foreign substances such as dust or the like which are present in the atmosphere through which the sample is carried become adhered to the sample surface to be treated during its conveyance. The thus adhered foreign substances deteriorate the quality of treatment, thereby causing a decrease in the manufacturing yield of a semiconductor element. Semiconductor elements are rapidly advancing nowadays in regard to their accuracy. The adhesion of foreign substances on the sample surface to be treated is considered to be one of the most acute problems presently faced.

Recently, for instance, an apparatus has been disclosed in the specification of Japanese Patent Laid-Open No. 197145/1984. In this disclosure, a method is proposed wherein the sample is carried with a surface to be treated being retained upright, i.e., in a vertical position, this contriving to constrain the adhesion of foreign substances on the sample surface to be treated at the time of the sample being conveyed. To be specific, the arrangement is such that the sample is carried between a treatment chamber and a portion in the atmosphere outside of the treatment chamber through a load lock station which is formed by a part of the treatment chamber employed as the main vacuum chamber in such a manner that the sample surface to be treated is held vertical. In this apparatus, the sample is conveyed while being held vertical, and hence the adhesion of foreign substances on the sample surface to be treated is constrained. On account of its constitution wherein the sample is carried between the treatment chamber and a portion of the atmosphere outside of the treatment chamber only through the load lock station, the vacuum load is, however, increased. This causes problems as regards properly maintaining the pressure within the treatment chamber, the factor exerting a great influence on the quality of treatment with respect to the sample.

SUMMARY OF THE INVENTION

Accordingly, it is a primary object of the present invention to provide a vacuum processing apparatus which is capable of enhancing the manufacturing yield of a semiconductor element and of constraining a decrease in the quality of treatment by a method wherein the adhesion of foreign substances on the sample surface to be treated is constrained when the sample is carried between a main vacuum chamber and a portion of the atmosphere outside the main vacuum chamber, and wherein the vacuum load is moderated and the pressure within the main vacuum chamber is properly maintained.

A vacuum processing apparatus according to the present invention comprises: a main vacuum chamber, a first vacuum preparatory chamber provided to be communicable with the main vacuum chamber; a second vacuum preparatory chamber provided to be communicable with the first vacuum preparatory chamber as well as to be opened to the atmosphere; a first conveying means which includes a pusher for retaining a sample in a vertical position, and which conveys the sample, while being retained in a vertical position, between a portion of the atmosphere outside of the main vacuum chamber and the second vacuum preparatory chamber, by reciprocal movement of the pusher; a second conveying means which includes a carrier for retaining the sample in a vertical position and which conveys the sample, while being retained in a vertical position, between the second vacuum preparatory chamber and the first vacuum preparatory chamber by movement of the carrier; and a third conveying means, in the first vacuum preparatory chamber, which includes an arm provided to be expandable and rotatable and also includes a retaining board mounted thereto for retaining the sample in a vertical position and which conveys the sample, in a vertical position, between the first vacuum preparatory chamber and the main vacuum chamber, by the expanding and rotating movement of the arm. By using the apparatus described above, it is possible to convey a sample, while being retained in a vertical position, between a portion of the atmosphere outside of the main vacuum chamber and the second vacuum preparatory chamber, between the second vacuum preparatory chamber and the first vacuum preparatory chamber, and between the first vacuum preparatory chamber and the main vacuum chamber, to thereby make it possible to restrain the adhesion of foreign substances on a surface to be treated of the sample, while the sample is carried between a portion of the atmosphere outside of the main vacuum chamber and the main vacuum chamber, as well as through the first vacuum preparatory chamber and the second vacuum preparatory chamber. It is also possible to reduce vacuum load and properly maintain a pressure in the main vacuum chamber while conveying the sample between the main vacuum chamber and a portion of the atmosphere outside of the main vacuum chamber.

DESCRIPTION OF THE DRAWINGS

FIG. 7 is a sectional view of the same portion shown in FIG. 2, the view illustrating another embodiment of a vacuum processing apparatus according to the present invention.

DESCRIPTION OF THE PREFERRED EMBODIMENTS

One embodiment of the present invention will hereinafter be described with reference to FIGS. 1 to 6 in combination. It is to be noted that, in this case, the description is made by exemplifying a continuous sputtering apparatus serving as the vacuum processing apparatus.

Figure 1:
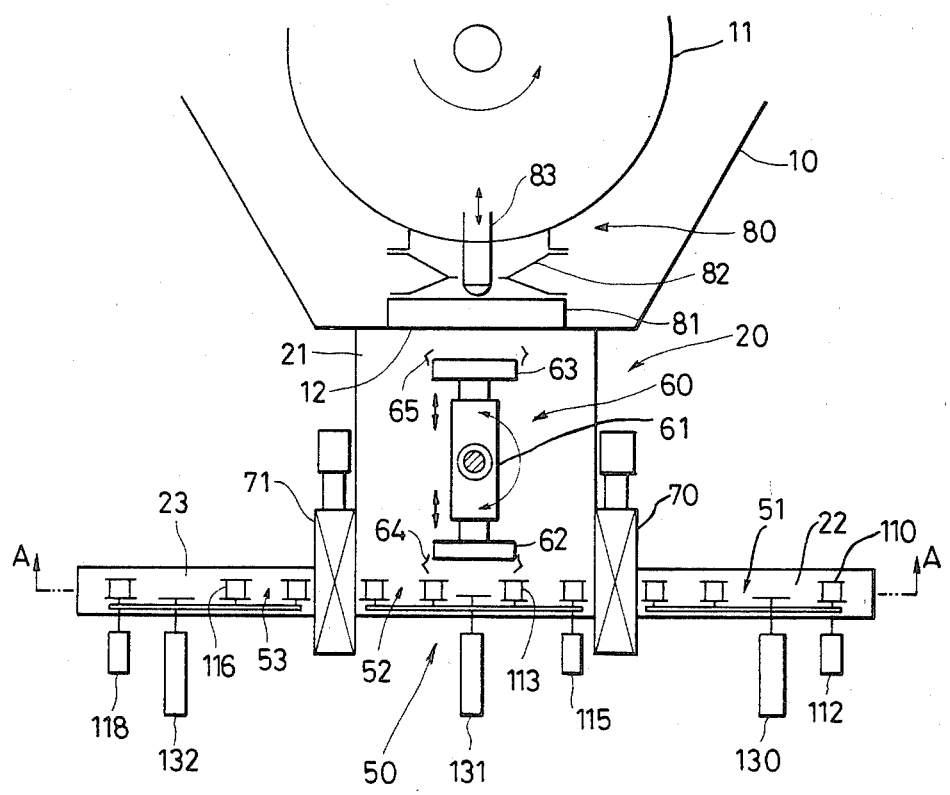
FIG. 1 is a plan block diagram of the principal portion of a continuous sputtering apparatus which shows one embodiment of a vacuum processing apparatus according to the present invention.
Figure 2:
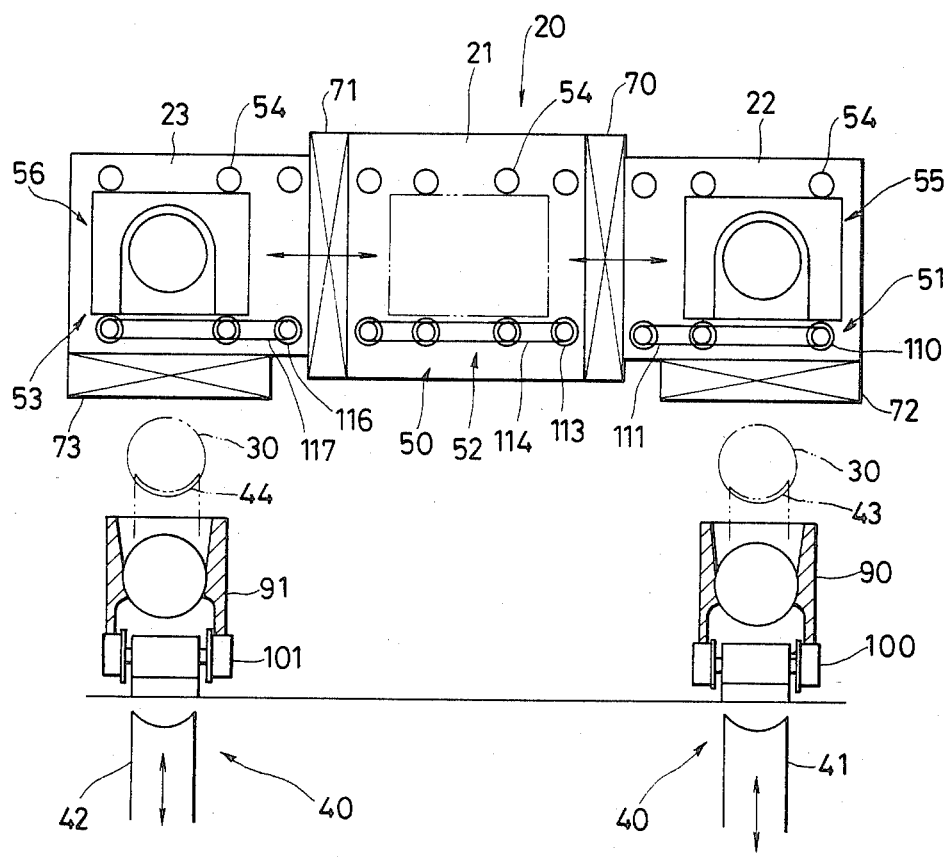
FIG. 2 is a sectional view taken in the direction of the line (A)—(A) of FIG. 1.
Figure 3:
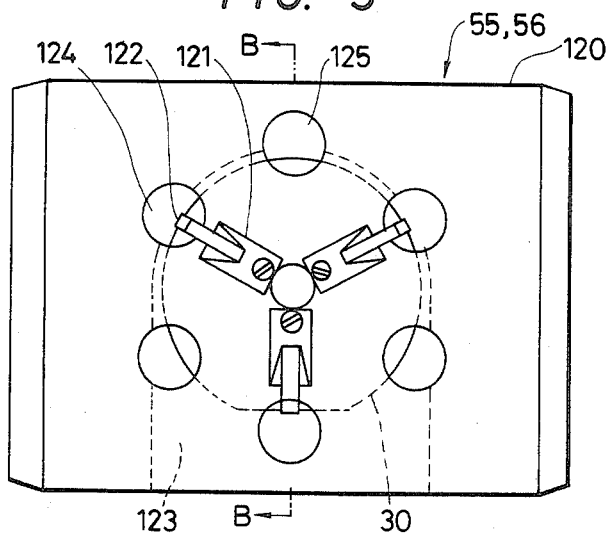
FIG. 3 is an elevational view of a carrier shown in FIG. 2.
Figure 4:
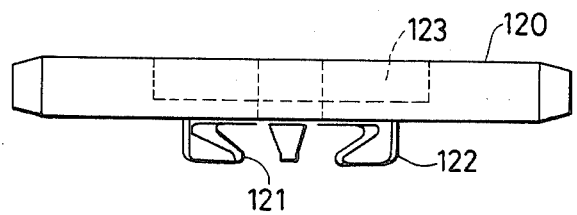
FIG. 4 is a view which shows the upper surface of the carrier illustrated in FIG. 3.
Figure 6:
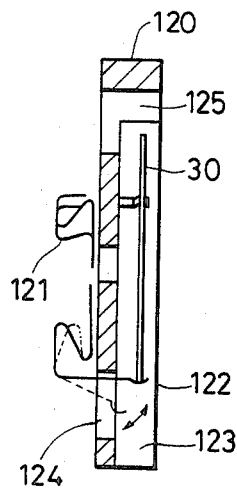
FIG. 6 is a sectional view of the carrier taken in the direction of the line (B)—(B) of FIG. 3.
Figure 5:
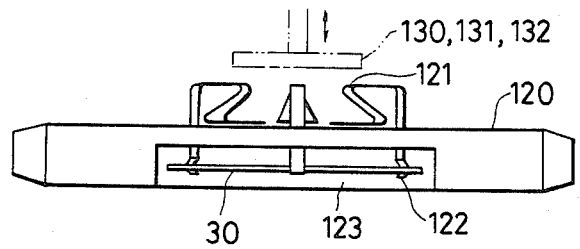
FIG. 5 is a view which shows the lower surface of the carrier illustrated in FIG. 3.

In FIGS. 1 and 2, a main vacuum chamber 10 includes a plurality of treatment chambers (illustration is omitted) which are provided on the circumference thereof. The main vacuum chamber 10 further includes a rotationary drum 11 which is so provided as to be intermittently rotatable, the arrangement being such that the drum surface thereof becomes the perpendicular surface and the center of the main vacuum chamber 10 is employed as the shaft axis. A conveying buffer chamber 21 is here employed as the first vacuum preparatory chamber; and the second vacuum preparatory chamber involves a load chamber 22 and an unload chamber 23. The conveying buffer chamber 21 is provided on the side wall of the main vacuum chamber 10 which is situated at the portion where no treatment chamber of the main vacuum chamber 10 is formed. An opening 12 is formed in the side wall of the main vacuum chamber 10 on which the conveying buffer chamber 21 is provided, such opening 12 being designed such that it is possible to carry in and out the sample, viz., a semiconductor element substrate 30 (hereinafter referred to as substrate) from the conveying buffer chamber 21 to the main vacuum chamber 10. The conveying buffer chamber 21 is communicated through the opening 12 with the main vacuum chamber 10. The load chamber 22 is provided through valve means, viz., a gate valve 70 on the side wall which is substantially orthogonal to the opening 12 of the conveying buffer chamber 21. The load chamber 22 communicates with the conveying buffer chamber 21 by opening a gate valve 70. The unload chamber 23 is provided through a gate valve 71 on the side wall which stands opposite to the side wall of the conveying buffer chamber 21 on which the load chamber 22 is provided. The unload chamber 23 communicates with the conveying buffer chamber 21 by opening a gate valve 71.

In FIG. 1, a substrate setting means is constituted by a substrate board 81, a spring 82 and a pusher 83. Such substrate setting means 80 is provided on the drum surface of the rotationary drum 11, the substrate setting means 80 being so located as to be capable of corresponding to the conveying buffer chamber 21 through the treatment chamber and the opening 12. Namely, the substrate board 81 is provided through the medium of the spring 82 on the drum surface of the rotationary drum 11 in such a way that the substrate setting surface thereof is arranged to be the substantially perpendicular surface, the substrate board 81 maintaining the hermetic properties with respect to the principal vacuum chamber 10. The pusher 83 passes through the drum surface of the rotationary drum 11 and is so provided as to be reciprocally movable for the purpose of moving the substrate board 81 to the side of opening 12 and the treatment chamber by pushing against the surface which is opposite to the substrate setting surface of the substrate board 81. That is, the communication between the main vacuum chamber 10 and the conveying buffer chamber 21 is cut off by moving the substrate board 81 towards the opening 12 so as to close the opening 12 with the substrate board 81 and the communication between the conveying buffer chamber 21 and the main vacuum chamber 10 is restored by moving the substrate board 81 in a direction opposite to the above-direction, or away from the opening 12.

In FIG. 2, a first conveying means 40 consists of pushers 41, 42 and a driving device (illustration is omitted) which reciprocally drives each of the pushers 41, 42. The pusher 41 is mounted to the driving device such as to fluctuate at the location which corresponds to a means of cutting off between the vacuum and the atmosphere, viz., a gate valve 72 provided on the bottom wall of the load chamber 22. A groove 43 is formed in the upper end surface which is corresponding to the gate valve 72 of the pusher 41, such groove 43 being capable of retaining the substrate 30 in a vertical position. A roller conveyer 100 for carrying a load cassette 90 is provided in the atmosphere on an ascending-descending route of the pusher 41 such as to be orthogonal to said route. The pusher 42 is mounted to the driving device such as to be fluctuable at the location which corresponds to the means of cutting off between the vacuum and the atmosphere, viz., a gate valve 73 which is provided on the bottom wall of the unload chamber 23. A groove 44 is formed in the upper end surface which is corresponding to the gate valve 73 of the pusher 42, such groove 44 being capable of retaining the substrate 30 in a vertical position. A roller conveyer 101 for carrying an unload cassette 91 is provided in the atmosphere on an ascending-descending route of the pusher 42 such as to be orthogonal to said route.

In FIGS. 1 and 2, a second conveying means 50 is constituted, for instance, by roller conveyers 51, 52, 53, a guide roller 54 and carriers 55, 56. The roller conveyer 51 consists of a roller 110, a chain 111 and a DC motor 112. The roller conveyer 52 consists of a roller 113, a chain 114 and a DC motor 115. The roller conveyer 53 consists of a roller 116, a chain 117 and a DC motor 118. A plurality of rollers 110 are so disposed in the load chamber 22 as to correspond to the bottom wall of the load chamber 22. The rollers 110 which correspond to the gate valve 72 are disposed at such spacings that they don't hinder the substrate 30 from being carried into the load chamber 22. A plurality of guide rollers 54 are provided in the load chamber 22 such as to be freely rotatable, these guide rollers 54 corresponding to the top wall and guiding the carrier 55 on which the substrate 30 is set in a vertical position, such carrier 55 being moved by means of the rollers 110 which go on rotating. One of the rollers 110 is connected to the DC motor 112 which is provided outside the load chamber 22. The chain 111 is endlessly wound around the rollers 110. A roller conveyer 52 is provided in the conveying buffer chamber 21 such as to be capable of receiving the carrier 55 which is carried through the gate valve 70 into the conveying buffer chamber 21 by means of the roller conveyer 51. A plurality of rollers 113 are so disposed in the conveying buffer chamber 21 as to correspond to the bottom wall of the conveying buffer chamber 21. A plurality of guide rollers 54 are provided in the conveying buffer chamber 21 such as to be freely rotatable, these guide rollers 54 corresponding to the top wall of the conveying buffer chamber 21 and guiding the carriers 55, 56 on which the substrate 30 is set in a vertical position, these carriers 55, 56 being moved by means of the rollers 113 which go on rotating. One of the rollers 113 is connected to a DC motor 115 which is provided outside the conveying buffer chamber 21. A chain 114 is endlessly wound around the roller 113. A roller conveyer 53 is provided in the unload chamber 23 such as to be capable of receiving the carrier 56 which is carried through the gate valve 71 into the unload chamber 23 by means of the roller conveyer 52. A plurality of rollers 116 are so disposed in the unload chamber 23 as to correspond to the bottom wall of the unload chamber 23. The rollers 115 corresponding to the gate valve 73 are disposed at such spacing that they don't hinder the substrate 30 from being carried out of the unload chamber 23. A plurality of guide rollers 54 are provided in the unload chamber 23 such as to be freely rotatable, these guide rollers 54 corresponding to the top wall of the unload chamber 23 and guiding the carrier 56 on which the substrate 30 is set in a vertical position, the carrier 56 being moved by means of the rollers which continue to rotate. One of the rollers 116 is connected to a DC motor 118 which is provided outside the unload chamber 23. A chain 117 is endlessly wound around the rollers 116.

In FIG. 1, a third conveying means 60 is constituted, for instance, by an arm 61 which is both expandable and rotatable, retaining boards 62, 63 and a driving device (illustration is omitted) for expanding and rotating the arm 61. The retaining boards 62, 63 are respectively provided at both ends of the arm 61. The driving device is provided outside the conveying buffer chamber 21. The arm 61 which is equipped with the substrate retaining boards 62, 63 is provided in the conveying buffer chamber 21 such that the substrate retaining surfaces of the retaining boards 62, 63 are directed in a substantially perpendicular direction. When the arm 61 ceases its rotation, either of the retaining boards 62, 63 is arranged to stand opposite to the substrate setting surface of the substrate board 81 of the substrate setting means 80 through the opening 12. The retaining boards 62, 63 are respectively provided with clips 64, 65 for releasing and grasping the substrate 30, these clips 64, 65 opening and closing in a radial direction.

In FIGS. 3 to 6, each of the carriers 55, 56 is constituted by a carrier body 120, springs 121 and clips 122. A recessed portion 123 is formed in one surface of the carrier body 120, such recessed portion 123 being designed for housing the substrate 30 and carrying the same substrate into the carrier body 120 and taking therefrom. In this case, the carrier body 120 has holes 124, 125 including a part of the recessed portion 123, the holes 124, 125 being respectively formed by three such as to be concentric at a pitch angle of 120°. Springs 121 are provided on one surface in which the recessed portion 123 of the carrier body 120 is formed and further the other surface opposite thereto. The spring 121 is provided with one end portion of the clip 122 such as to be capable of opening and closing by way of the elastic deformation of the spring 121; and the other end portion of the clip 122 is arranged to extend through the hole 124 into the recessed portion 123. Furthermore, the other end portion takes such configuration as to be capable of grasping the substrate 30. In addition, clips 64, 65 of the third conveying means 60 are inserted in the holes 125 when the delivery of the substrate 30 is effected between the carriers 55, 56 and the third conveying means 60.

In FIG. 1, a pusher 130 is provided in the load chamber 22, the pusher 130 making the clip 122 of the carrier 55 grasp the substrate 30 which is carried through the gate valve 72 into the load chamber 22 by means of a pusher 41. A pusher 131 is provided in the conveying buffer chamber 21, the pusher 131 releasing the substrate 30 which is grasped by the clip 122 of the carrier 55 and then making the clip 122 of the carrier 56 grasp the substrate 30. A pusher 132 is provided in the unload chamber 23, this pusher 132 releasing the substrate 30 which is carried from the conveying buffer chamber 21 through the gate valve 71 into the unload chamber 23 and is then grasped by the clip 122 of the carrier 56. It is to be remarked that an evacuating means (illustration is omitted) is provided. This evacuating means is designed for respectively evacuating the main vacuum chamber 10, the conveying buffer chamber 21, the load chamber 22 and the unload chamber 23.

In FIGS. 1 to 6, the main vacuum chamber 10 and the conveying buffer chamber 21 are evacuated to a predetermined level (in this case, $10^{-7} \sim 10^{-8}$ Torr) by the evacuating means. Such being the case, each of the gate valves 70, 71 is shut off and the substrate board 81 is in a state wherein it is pulled in on the side of the drum surface of the rotationary drum 11 by virtue of the spring tension of the spring 82. On the other hand, a plurality of the substrates 30 are housed in a load cassette 90 in such a manner that the respective substrates are aligned in a vertical position at regular pitches. This load cassette 90 is mounted on the roller conveyer 100 and is then conveyed to the lower position of the load chamber 22. Thereafter, the conveyance is halted, for instance, just when the forehand substrate 30 comes to the location which corresponds to a groove 43 of the pusher 41. At this time, the gate valve 72 is released and the inside of the load chamber 22 is communicated with the outside. The carrier 55 is made to move to a certain position by way of the actuation of the roller conveyer 51, such position enabling the substrate 30 to be housed in the recessed portion 123. In such a state, the substrate 30 housed in the front row of the load cassette 90 is received by the pusher 41 in such a manner that the substrate surface to be treated is directed in a vertical position on account of an arrangement wherein the pusher 41 is raised by means of the driving device. Thereafter, the substrate 30 is, in this position, carried from the outside portion through the gate valve 72 into the load chamber 22 and is then housed in the recessed portion 123 of the carrier 55 by further making the pusher 41 ascend. Such being the case, the clip 122 of the carrier 55 is opened by pushing the spring 121 with the pusher 130 prior to a step wherein the substrate 30 is housed in the recessed portion 123. The substrate 30 has completely been housed in the recessed portion 123, this immediately leading to a process wherein the pushing operation of the spring 121 with the aid of the pusher 130 is released and then the clip 122 is closed by way of the spring tension of the spring 121. With this arrangement, the substrate 30 is grasped by the clip 122 while being retained in a vertical position. The pusher 41 which delivers the substrate 30 to the carrier 55 is made to descend so as to be retreated to the outside waiting position. Thereafter, the gate valve 72 is shut off, and the load chamber 22 is so evacuated as to be equal to the pressure within the conveying buffer chamber 21 by way of the operation of the evacuating means. Then, the gate valve 70 is opened, whereby the conveying buffer chamber 21 and the load chamber 22 are communicated with respect to each other. The carrier 55 is carried from the load chamber 22 through the gate valve 70 into the conveying buffer chamber 21 by virtue of the actuation of the roller conveyers 51, 52. Thereafter, the roller conveyer 51 stops functioning. The carrier 55 which is conveyed into the conveying buffer chamber 21 is further carried by the operation of the roller conveyer 52 to the position corresponding to the retaining board 62 of the third conveying means 60 and is then halted. The retaining board 62 is moved by operation of the driving device from the carrier 55 through the arm 61 to the position where the clip 64 is capable of catching hold of the substrate 30 while being retained in a vertical position. Then, the clip 122 is made to open such as to resist against the spring tension of the spring 121 by an arrangement wherein the spring 121 of the carrier 55 is pushed by the pusher 131, thereby releasing the substrate 30 from the clip 122. Incidentally, prior to this step, the substrate 30 is grasped by the clip 64. Owing to these steps, the substrate 30 of the carrier 55 is delivered to the third conveying means 60 while being retained in a vertical position. After the clip 64 has grasped the substrate 30, the retaining board 62 is returned to its initial position. On the other hand, after the pushing operation of the spring 121 with the aid of the pusher 131 has been released, the carrier 55 which delivers the substrate 30 to the conveying means 60 is returned from the conveying buffer chamber 21 via the gate valve 70 into the load chamber 22 by way of the actuation of the roller conveyers 51, 52 and is then made to wait at the position where it is feasible to house another substrate 30 in the recessed portion 123. Thereafter, the gate valve 70 is shut off. The substrate board 81 which is situated corresponding to the opening 12 is pushed by the pusher 83 and is then moved to the side of the opening 12 such as to resist against the spring tension of the spring 82. Such movement of the substrate board 81 is creased just when the outer peripheral surface excluding the substrate setting surface of the substrate board 81 in a vertical position. Thereafter, by way of a step wherein the arm 61 is led out by actuating the driving device, the substrate 30 is in this state conveyed such that the rear surface of the substrate 30 impinges on the substrate setting surface of the substrate board 81. The clip 64 is then opened, thereby releasing the substrate 30 from the clip 64. Incidentally, prior to this process, the substrate 30 is placed on the substrate setting surface of the substrate board 81 by use of a clip or the like (illustration is omitted). With these arrangements, the substrate 30 is delivered by the third conveying means 60 to one of the substrate setting means 80 provided within the main vacuum chamber 10 such that the substrate surface to be treated is directed in a perpendicular direction. The arm 61 is then returned to its original state. Moreover, the pushing operation by the pusher 83 of the substrate board 81 is released and hence the substrate board 81 is returned to the side of the drum surface of the rotationary drum 11 by virtue of the spring tension of the spring 82. The substrate 30, which is placed on the substrate setting surface of the substrate board 81 such that the substrate surface to be treated is directed in a perpendicular direction, is conveyed by way of the intermittent rotation of the rotationary drum 11 to the positions which in sequence correspond to each of the treatment chambers. Meanwhile, a film is formed by sputtering on the surface of the substrate 30 to be treated. The film forming treatment is completed with respect to the substrate 30 by way of the above-described intermittent rotation. Such substrate 30 makes one revolution and is then returned to the position which corresponds to the opening 12. Thereafter, the substrate 30 is conveyed from the main vacuum chamber 10 to the conveying buffer chamber 21 with the opposite operation to the above-described one and is further carried to the location which is corresponding to the pusher 131. Moreover, the clip 65 receives another substrate 30 from the carrier 55, such other substrate 30 being grasped by the clip 122 of the carrier 55 and then being conveyed into the conveying buffer chamber 21 by much the same operation as the previous one. This other substrate 30 is carried to the location which corresponds to the substrate setting surface of the substrate board 81 at the time of the first substrate 30 being conveyed when the above-mentioned film forming treatment is completed. This other substrate 30 is intermittently rotated in the same way as the previous case. Meanwhile, a film is formed by sputtering on the surface of this other substrate 30 to be treated. The first substrate 30 which is carried to the position corresponding to the pusher 131 and finishes undergoing the film forming treatment is delivered from the third conveying means 60 to the carrier 56. Thereafter, the substrate 30 is further carried from the conveying buffer chamber 21 through the gate valve 71 into the evacuated unload chamber 23 by way of the operation of the roller conveyers 52, 53. The gate valve 72 is then shut off, whereas the gate valve 73 is opened. The substrate 30 which has been subjected to the film forming treatment is delivered from the carrier 56 to the pusher 42 and is then recovered by the unload cassette 91. The substrates 30 which are housed in the load cassette 90 are taken out by a sheet from the load cassette 90 in such a way that the substrate surface to be treated is directed in a vertical position by successively effecting the above-mentioned operations in sequence. The thus taken-out substrates 30 are conveyed via the load chamber 22 and the conveying buffer chamber 21 into the main vacuum chamber 10 and are successively subjected to the film forming treatment in sequence. Concomitantly, the substrates 30 which have finished undergoing the film forming treatment are taken outside from the main vacuum chamber 10 through the conveying buffer chamber 21 and the unload chamber 23 and are then recovered by a sheet by the unload cassette 91.

According to the present embodiment, the following effects can be obtained.

(1) Inasmuch as it is possible to convey a substrate between a main vacuum chamber and a portion of the atmosphere outside the main vacuum chamber in a vertical position, the adhesion of foreign substances on the substrate surface to be treated can be prevented, while at the same time, the constitution is such that the sample is conveyed between the main vacuum chamber and a portion in the atmosphere outside the main vacuum chamber via a conveying buffer chamber, a load chamber and an unload chamber. Hence, a vacuum load can be decreased, and it is possible to properly maintain the pressure within the main vacuum chamber so as to be suitable for forming a sputtering film. It is therefore practicable to constrain the deterioration of the sputtering film formed on the substrate and to enhance a manufacturing yield of a semiconductor element.

(2) Since the substrate is arranged to be carried such as to be held by a carrier, it is possible to stably and easily perform the conveyance of the substrate in a vertical position.

(3) The substrate is arranged to be conveyed such as to be held by the carrier and hence it is feasible to prevent the substrate from suffering damages at the time of its conveyance.

FIG. 7 shows a second embodiment of the present invention. A different point between an arrangement of the second embodiment and that of the previous embodiment shown in FIG. 2 according to the present invention is described as follows. A second conveying means 50 is constituted by carriers 55, 56 and driving devices 142, 143 which reciprocate shafts 140, 141.

In FIG. 7, the shaft 140 is so provided as to pass through the side wall which stands opposite to the side wall on which the gate valve 70 of the load chamber 22 is provided, the shaft 140 being reciprocable and maintaining the hermetic properties thereof. The driving device 142 is provided outside the load chamber 22; and one end portion of the shaft 140 is connected to the driving device 142. The carrier 55 is provided at the other end portion of the shaft 140 so as to be capable of retaining the substrate 30 in a vertical position. The reciprocal stroke of the shaft 140 makes the following steps possible: the carrier 55 receives the substrate 30 from a first conveying means 40; and further the substrate 30 is delivered from the carrier 55 to a third conveying means (illustration is omitted). Furthermore, the shaft 141 is so provided as to pass through the side wall which stands opposite to the side wall on which the gate valve 71 of the unload chamber 23 is provided, the shaft 141 being reciprocable and maintaining the hermetic properties thereof. The driving device 143 is provided outside the unload chamber 23; and one end portion of the shaft 141 is connected to the driving device 143. The carrier 56 is provided at the other end portion of the shaft 141 so as to be capable of retaining the substrate 30 in a vertical position. The reciprocal stroke of the shaft 141 makes the following steps possible: the carrier 56 receives the substrate 30 from the third conveying means; and the substrate 30 is delivered from the carrier 56 to the first conveying means 40. It is to be noted that, so far as the FIG. 7 is concerned, the same devices and their related parts are indicated with the same reference numerals as shown in FIG. 2, so that the descriptions thereof are omitted. In this embodiment, the following effects except for those gained in above-described one embodiment according to the present invention can be obtained.

(1) A carrier can be conveyed without depending on the frictional force, thereby making it possible to more stably carry the substrate carrier.

(2) Inasmuch as the moving rate of the carrier can securely be controlled by controlling the reciprocal stroke of the shaft, it is feasible to perform the positioning control with high accuracy, such control being required for the delivery of the substrate.

Moreover, in the above-described embodiments, the load chamber and the unload chamber are separated from each other. It is, however, a matter of course that these chambers may be defined as a combined chamber, viz., a load-unload chamber, in case where such factors as using forms, structures, sizes and so on with respect to the apparatus are taken into consideration. In the above-mentioned embodiments, the arrangement is such that the carrier is made to horizontally move between the load chamber and the conveying buffer chamber and further between the conveying buffer chamber and the unload chamber. Except for this arrangement, however, it is permittable that, for instance, a sprocket wheel is provided instead of a roller conveyer and sprocket holes are formed in the carrier, thereby moving the carrier. In this case, the arrangement is such that the load chamber and the unload chamber are provided in a vertical direction through the medium of the gate valve in the conveying buffer chamber. Such being the case, the occupying floor area of the apparatus can further be decreased.

According to the present invention, as described above, it is practicable to convey the substrate in such a way that the substrate surface to be treated is directed in a vertical position between the main vacuum chamber and the first vacuum preparatory chamber which is provided through the medium of a gate valve in the main vacuum chamber and between the first vacuum preparatory chamber and the second vacuum preparatory chamber which is provided through the medium of a gate valve in the first vacuum preparatory chamber and further between the second vacuum preparatory chamber and the outside portion. Hence, it is feasible to constrain the adhesion of foreign substances on the substrate surface to be treated when it is carried between the main vacuum chamber and the outside portion. The substrate is conveyed through the first vacuum preparatory chamber and the second vacuum preparatory chamber between the main vacuum chamber and the outside portion, this structure making it possible to lighten the vacuum load and to properly maintain the pressure within the main vacuum chamber. Such pressure exerts a great influence on the quality of treatment with respect to the substrate. Therefore, desirable effects are obtained wherein it is feasible to constrain the deterioration of the quality of treatment and to improve the manufacturing yield of the semiconductor element.

What is claimed is:

1. A vacuum processing apparatus comprising:
   a main vacuum chamber;
   a first vacuum preparatory chamber provided to be communicable with said main vacuum chamber;
   a second vacuum preparatory chamber provided to be cummunicable with said first vacuum preparatory chamber as well as to be opened to the atmosphere;
   a first conveying means, which includes a pusher for retaining a sample in a vertical position and which is adapted to convey the sample, while being retained in a vertical position, between a portion of the atmosphere outside of said main vacuum chamber and said second vacuum preparatory chamber by reciprocal movement of said pusher;
   a second conveying means, which includes a carrier for retaining the sample in a vertical position and which conveys the sample, while being retained in a vertical position, between said second vacuum preparatory chamber and said first vacuum preparatory chamber, by movement of said carrier; and
   a third conveying means, in said first vacuum preparatory chamber, which includes an arm provided to be expandable and rotatable and also includes a retaining board mounted thereto for retaining the sample in a vertical position and which conveys the sample, while being retained in a vertical position, between said first vacuum preparatory chamber and said main vacuum chamber, by expanding and rotating movement of said arm.

2. A vacuum processing apparatus as set forth in claim 1, wherein the second conveying words included a means of moving said carrier within said first vacuum preparatory chamber and said second vacuum preparatory chamber said moving means being constituted by a roller conveyer and a guide roller guiding said carrier which is moved by means of said roller conveyer.

3. A vacuum processing apparatus as set forth in claim 1, wherein the second conveying means includes a means of moving said carrier within said first vacuum preparatory chamber and said second vacuum preparatory chamber, said moving means being constituted by a shaft which is provided with said carrier and by a driving device reciprocating said shaft.

4. A vacuum processing apparatus as set forth in claim 1, wherein said carrier is constituted by a carrier body, a spring and a clip, said carrier body having a recessed portion which houses said sample and is suitable for carrying in and out said sample and having a plurality of holes including a part of said recessed portion, said holes being concentrically formed therein, said spring being provided on the surface of said carrier body which is opposite to the surface in which said recessed portion is formed, said clip including its one end with which said spring is equipped and the other end thereof which extends through said hole into said recessed portion.

5. A vacuum processing apparatus as set forth in claim 1, wherein a groove is formed in a surface of said pusher, the location of the groove corresponding to a location of entry which corresponds to said second vacuum preparatory chamber from said portion of the atmosphere outside of said main vacuum chamber, said groove being capable of retaining said sample in a vertical position.

* * * * *